(12) United States Patent
Mikulics et al.

(10) Patent No.: US 9,735,247 B2
(45) Date of Patent: Aug. 15, 2017

(54) HIGH-FREQUENCY CONDUCTOR HAVING IMPROVED CONDUCTIVITY

(71) Applicant: Forschungszentrum Juelich GmbH, Juelich (DE)

(72) Inventors: Martin Mikulics, Juelich (DE); Hilde Hardtdegen, Aachen (DE); Detlev Gruetzmacher, Niederzier (DE)

(73) Assignee: Forschungszentrum Juelich GmbH, Juelich (DE)

( * ) Notice: Subject to any disclaimer, the term of this patent is extended or adjusted under 35 U.S.C. 154(b) by 0 days.

(21) Appl. No.: 14/771,959

(22) PCT Filed: Mar. 20, 2014

(86) PCT No.: PCT/DE2014/000149
§ 371 (c)(1),
(2) Date: Sep. 1, 2015

(87) PCT Pub. No.: WO2014/169887
PCT Pub. Date: Oct. 23, 2014

(65) Prior Publication Data
US 2016/0013285 A1     Jan. 14, 2016

(30) Foreign Application Priority Data
Apr. 18, 2013   (DE) .................. 10 2013 006 624

(51) Int. Cl.
*H01L 29/47*     (2006.01)
*H01L 29/812*    (2006.01)
(Continued)

(52) U.S. Cl.
CPC ............ *H01L 29/45* (2013.01); *H01L 21/283* (2013.01); *H01L 21/28587* (2013.01);
(Continued)

(58) Field of Classification Search
CPC ............... H01L 29/45; H01L 29/32133; H01L 29/42316; H01L 29/42372; H01L 29/475;
(Continued)

(56) References Cited

U.S. PATENT DOCUMENTS 4,624,004 A * 11/1986 Calviello ............ H01L 29/4175
                                                    257/276
4,935,805 A *  6/1990 Calviello .......... H01L 29/66863
                                                    257/751
(Continued)

FOREIGN PATENT DOCUMENTS

CN       1348255       5/2002
EP       1 978 472     3/2008
(Continued)

OTHER PUBLICATIONS

Kirt R. Williams, Etch Rates for Micromachining Process—Part II, Dec. 2003, Journal of Microelectromechanical Systems, vol. 12, No. 3, pp. 761-778.*

(Continued)

*Primary Examiner* — Yu Chen
*Assistant Examiner* — Scott Bauman
(74) *Attorney, Agent, or Firm* — Jordan and Koda, PLLC (57) ABSTRACT

A high-frequency conductor having improved conductivity comprises at least one electrically conductive base material. The ratio of the outer and inner surfaces of the base material permeable by a current to the total volume of the base material is increased by a) dividing the base material perpendicularly to the direction of current into at least two segments, which are spaced from each other by an electrically conductive intermediate piece and connected both electrically and mechanically to each other, and/or b) topographical structures in or on the surface of the base material and/or c) inner porosity of at least a portion of the base (Continued)

material compared to a design of the base material in which the respective feature was omitted. It was found that, as a result of these measures concerning the design, it is possible to physically arrange the same amount abase material so that a larger fraction of the base material is located at a distance of no more than skin depth from an outer or inner surface and is thus involved in current transport. As a result, a lesser fraction remains unused as a function of the skin effect.

10 Claims, 5 Drawing Sheets

(51) Int. Cl.
| | |
|---|---|
| H01L 29/45 | (2006.01) |
| H01L 29/40 | (2006.01) |
| H01L 29/423 | (2006.01) |
| H01L 29/778 | (2006.01) |
| H01L 29/66 | (2006.01) |
| H01L 29/765 | (2006.01) |
| H01L 31/0224 | (2006.01) |
| H01L 21/285 | (2006.01) |
| H01L 21/283 | (2006.01) |
| H01L 21/3213 | (2006.01) |
| H01L 29/49 | (2006.01) |
| H01L 29/20 | (2006.01) |

(52) U.S. Cl.
CPC ........ *H01L 21/3213* (2013.01); *H01L 29/404* (2013.01); *H01L 29/42316* (2013.01); *H01L 29/42372* (2013.01); *H01L 29/42376* (2013.01); *H01L 29/475* (2013.01); *H01L 29/4966* (2013.01); *H01L 29/66856* (2013.01); *H01L 29/765* (2013.01); *H01L 29/7786* (2013.01); *H01L 29/7787* (2013.01); *H01L 29/812* (2013.01); *H01L 31/0224* (2013.01); *H01L 31/022408* (2013.01); *H01L 29/2003* (2013.01)

(58) Field of Classification Search
CPC . H01L 29/47; H01L 29/4966; H01L 29/7786; H01L 29/201; H01L 31/0224; H01L 21/283; H01L 21/28587; H01L 21/28593; H01L 21/3213; H01L 21/32133; H01L 29/404; H01L 29/42376; H01L 29/812; H01L 29/66856; H01L 29/66462; H01L 29/7787; H01L 29/66962; H01L 29/765; H01L 29/66946; H01L 31/022408; H01L 23/5226; H01L 23/5283; H01L 23/53209; H01L 23/53228; H01L 23/53233; H01L 23/53242; H01L 23/53257; H01L 23/53261; H01L 23/53247
USPC ........................................................ 257/734
See application file for complete search history.

(56) References Cited

U.S. PATENT DOCUMENTS

| | | | |
|---|---|---|---|
| 4,959,326 A | 9/1990 | Roman et al. | |
| 5,179,041 A * | 1/1993 | Yano | H01L 21/28575 |
| | | | 257/E21.172 |
| 5,211,807 A * | 5/1993 | Yee | C23F 1/14 |
| | | | 216/100 |
| 5,281,769 A | 1/1994 | Hirano et al. | |
| 5,479,053 A | 12/1995 | Oda | |
| 5,502,335 A | 3/1996 | Oda | |
| 5,550,068 A | 8/1996 | Hirano et al. | |
| 6,400,027 B1 | 6/2002 | Takahashi | |
| 7,875,958 B2 * | 1/2011 | Cheng | B82Y 10/00 |
| | | | 257/190 |
| 8,039,847 B2 * | 10/2011 | Nuzzo | B82Y 10/00 |
| | | | 216/2 |
| 2001/0033210 A1 | 10/2001 | Tanabe | |
| 2002/0003305 A1* | 1/2002 | Umakoshi | H01L 21/76802 |
| | | | 257/760 |
| 2002/0163079 A1 | 11/2002 | Awano | |
| 2003/0234437 A1 | 12/2003 | Yamamoto et al. | |
| 2006/0071271 A1 | 4/2006 | Omura et al. | |
| 2008/0085120 A1* | 4/2008 | Xie | G02F 1/218 |
| | | | 398/135 |
| 2010/0230717 A1 | 9/2010 | Saito | |
| 2012/0305059 A1* | 12/2012 | Kayes | H01L 31/065 |
| | | | 136/255 |
| 2014/0077239 A1* | 3/2014 | Hung | H01L 21/02458 |
| | | | 257/94 |
| 2014/0183736 A1* | 7/2014 | Cox | H01L 51/442 |
| | | | 257/741 |
| 2014/0291606 A1* | 10/2014 | Avouris | H01L 51/0048 |
| | | | 257/9 |

FOREIGN PATENT DOCUMENTS

| | | |
|---|---|---|
| EP | 2 120 257 | 2/2009 |
| JP | 2009-004435 | 1/2009 |
| JP | 2010-034347 | 2/2010 |

OTHER PUBLICATIONS

"Photodetectors and Solar Cells", Web Page <https://courses.cit.cornell.edu/ece533/Lectures/handout5.pdf>, First Page, Jul. 26, 2010, retrieved from Internet Archive Wayback Machine <http://web.archive.org/web/20100601000000*/https://courses.cit.cornell.edu/ece533/Lectures/handout5.pdf> on Aug. 5, 2016.*
Rik Jos, Reverse Schottky gate current in AlGaN—GaN high-electron-mobility-transistors, Oct. 2012, American Institute of Physics, Journal of Applied Physics vol. 112 Issue 9.*
Orlowski et al, Si, SiGe, Ge, and III-V Semiconductor Nanomembranes and Nanowires Enabled by SiGe Epitaxy, 2010, ECS Transactions, vol. 33, Issue 6, pp. 777-789.*
Kohno Y et al; "K-Band High Gain Reliability Gaas Power Fet with Sub-Half Micron Wsi/au T-Shaped Gate", Oct. 16, 1994; Oct. 16, 1994-Oct. 19, 1994, Oct. 16, 1994 (Oct. 16, 1994), pp. 137-140, XP010255314 figure 2.

* cited by examiner

HIGH-FREQUENCY CONDUCTOR HAVING IMPROVED CONDUCTIVITY

The invention relates to a high-frequency conductor having improved conductivity.

BACKGROUND OF THE INVENTION

Direct current entirely permeates an electric conductor through which the current is conducted. Alternating current penetrates into the conductor only to a material- and frequency-dependent skin depth since the alternating magnetic field generated by the current, due to Lenz's law, induces a countervoltage in the conductor interior which pushes the current to the edge of the conductor. As a result, current transport is possible only in the edge region of the conductor cross-section to skin depth. The remaining conductor cross-section does not contribute to current transport. It is known to increase the conductor to reduce the electric resistance of the conductor, so that the edge region carrying the current also becomes larger. The drawback is that a small gain in conductivity is achieved in exchange for a large additional volume of conductor material, which due to the skin effect is not involved in current transport. The best-conducting metals are precious metals, which are thus very valuable.

It is therefore the object of the invention to provide a high-frequency conductor that has improved conductivity, yet lower material costs.

This object is achieved according to the invention by a high-frequency conductor and by a production method according to the invention.

Within the scope of the invention, a high-frequency conductor was developed which comprises at least one electrically conductive base material.

SUMMARY OF THE INVENTION

According to the invention, the ratio of the outer and inner surfaces of the base material permeable by a current to the total volume of the base material is increased by
a) dividing the base material perpendicularly to the direction of current into at least two segments, which are spaced from each other by an electrically conductive intermediate piece and connected both electrically and mechanically to each other, and/or
b) topographical structures in or on the surface of the base material
and/or
c) inner porosity of at least a portion of the base material compared to a design of the base material in which the respective feature was omitted.

It was found that, as a result of these measures concerning the design, it is possible to physically arrange the same amount of base material so that a larger fraction of the base material is located at a distance of no more than skin depth from an outer or inner surface and is thus involved in current transport. As a result, a lesser fraction remains unused as a function of the skin effect.

If the base material is segmented, advantageously at least one segment in every direction located perpendicularly on the direction of current has an extension between twice the skin depth of the base material at the maximum operating frequency and 2.5 times the skin depth of the base material at the lowest operating frequency. A lesser extension reduces conductivity, and a considerably higher extension only causes higher material costs, but no further gain in conductivity.

The intermediate piece is advantageously made of as material that is attacked by an etchant, against which the base material is resistant. The high-frequency conductor is then particularly easy to produce by growing alternating layers of the base material and of the material of the intermediate piece onto the substrate, and subsequently applying the etchant. The layers made of the material of the intermediate piece are then attacked simultaneously from two sides. A rest remains in the center between two areas of attack, the width of the rest being dependent on the etching duration and the etching rate. No complicated sequence of lithography steps is necessary.

The only requirements in regard to the intermediate piece are that the same has metallic conductivity and that it is mechanically stable. If the high-frequency conductor is applied to a semiconductor, there is a group of particularly suitable conductive materials available for every semiconductor, which form a Schottky contact with the semiconductor, for example.

The material of the intermediate piece is advantageously a metal from group 3A or 4A or a transition metal, or it contains at least one such metal as an alloying element. Particularly advantageously, the material of the intermediate piece belongs to the group (Ti, V, Cr, Mn, Fe, Co, Ni, Cu, Zn), or it contains at least one metal from this group as an alloying element. These materials combine acceptable conductivity with good etchability, in particular when using wet-chemical etchants. However, when a production method is used in which this is not a factor, the material of the intermediate piece may also be a precious metal, for example, and in particular it may be identical to the base material.

If the base material is topographically structured, advantageously at least 30%, preferably at least 50%, and most particularly preferably at least 80% of the topographical structures in every direction located perpendicularly to the direction of current have an extension between twice the skin depth of the base material at the maximum operating frequency and 2.5 times the skin depth of the base material at the lowest operating frequency. The structures are then substantially completely permeated by the current.

If the base material is porous, the smallest distance between at least 30%, preferably at least 50%, and most particularly preferably at least 80% of the pores and the closest neighbors thereof is advantageously between twice the skin depth of the base material at the maximum operating frequency and 2.5 times the skin depth of the base material at the lowest operating frequency. The regions between the pores are then substantially completely permeated by the current, and only small amounts of base material that do not contribute to current transport remain.

The base material is advantageously carbon or a precious metal or semi-precious metal, or it contains at least one material from this group as an alloying element. In a particularly advantageous embodiment of the invention, the base material belongs to the group (Ru, Rh, Pd, Ag, Os, Ir, Pt, Au), or it contains at least one metal from this group as an alloying element. Carbon and these precious metals not only offer the best electrical conductivity, but are also resistant against environmental influences and against wet-chemical etchants, which may be used to produce intermediate pieces.

In a particularly advantageous embodiment of the invention, the high-frequency conductor is designed as a control electrode of a transistor. It may in particular be designed as the gate electrode of a field effect transistor. In the case of a field effect transistor, the important factor, in the interest of a preferably high switching frequency and edge steepness for the switching process, is to be able to apply a charge to the gate electrode as quickly as possible or, conversely, to be able to dissipate a charge from the same as quickly as possible.

As a gate electrode, the high-frequency conductor is advantageously coupled to the semiconducting gate of the field effect transistor via an electrically conducting intermediate piece, which defines the gate length. The shorter the gate length, the greater is the maximal switching frequency of the transistor.

In a further particularly advantageous embodiment of the invention, the high-frequency conductor is designed as a collector electrode or drain electrode of a photodetector. In particular in a photodetector according to the metal-semiconductor-metal (MSM) principle, quantum efficiency improves as the electrical resistance of the collector and drain electrodes decreases.

Based on the above, the invention also relates to a method for producing a high-frequency conductor according to the invention. To this end, alternating layers of the base material of the intermediate piece and of the base material are grown onto a substrate. The layer stack is subsequently exposed to an etchant, which isotropically etches the material of the intermediate piece, yet at the same time does not attack the substrate or the base material. The combination of the etching rate with the etching duration allows the width of the intermediate piece that remains after the etching process to be set.

Advantageously a dilutable etchant is selected. The etching rate can then be set by way of the degree of dilution. The etchant can be an acid or a base, for example. The dilution can be, but does not have to be, carried out with water. It is also possible, for example, to use other solvents for dilution.

The subject matter of the invention will be described hereafter based on figures, without thereby limiting the subject matter of the invention.

DESCRIPTION OF THE PREFERRED EMBODIMENTS

Figure 1A:
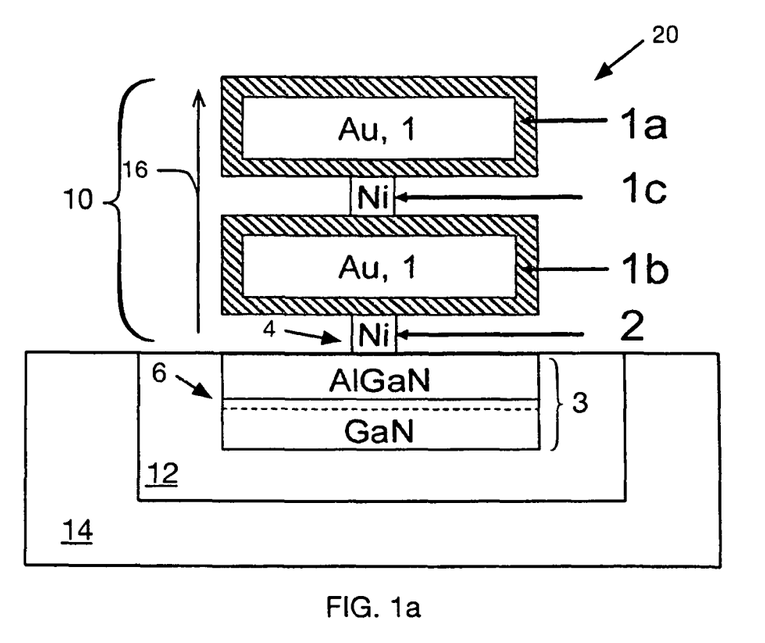
FIG. 1a shows an exemplary embodiment of the high-frequency conductor according to the invention.

FIG. 1a shows a sectional drawing of an exemplary embodiment of an integrated circuit 20 having the high-frequency conductor 1 according to the invention. The high-frequency conductor 1 is coupled via an intermediate piece 2 made of nickel, which defines the gate length, to an AlGaN/GaN heterostructure 3 as the terminal 6 (e.g. semiconducting gate) of a transistor 12 (e.g., field effect transistor.) The high-frequency conductor 1 and intermediate piece 2 together form a high-frequency electrode 10 having a Schottky contact 4 with the terminal 6 of transistor 12. The heterostructure 3 is located on a substrate 14 (e.g., sapphire substrate.) The source and drain regions of the transistor, including contacting, are not shown for the sake of clarity. The base material, which is gold, of the high-frequency conductor 1 is divided into two segments 1a and 1b, which are electrically and mechanically connected to each other by an intermediate piece 1c made of nickel. The current, which supplies a charge to the gate or dissipates the charge from the same again, flows perpendicularly to the drawing plane in a current direction 16. Due to the skin effect, only the hatched fractions of the two segments 1a and 1b near the surface contribute to current transport through the high-frequency conductor 1. The current transport through the more poorly conducting intermediate pieces 1c and 2 is disregarded in FIG. 1 for the sake of clarity.

Figure 1B:
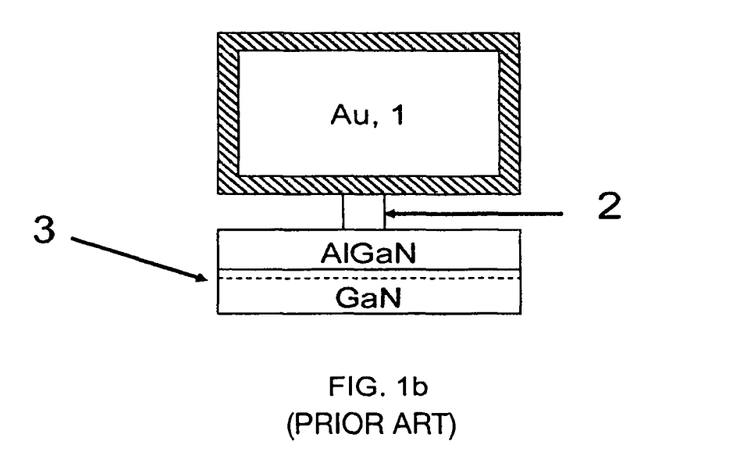
FIG. 1b shows a conventional embodiment of a high-frequency conductor.

For comparison, FIG. 1b shows a sectional drawing of a high-frequency conductor 1 according to the prior art, which contains the same amount of base material as the exemplary embodiment according to FIG. 1a. Here, the division of the base material into two segments has been omitted. Consequently, the lower edge of segment 1a and the upper edge of segment 1b are not regions near the surface which contribute to current transport. As a result, only a considerably smaller portion of the valuable base material is used for current transport.

Figure 2:
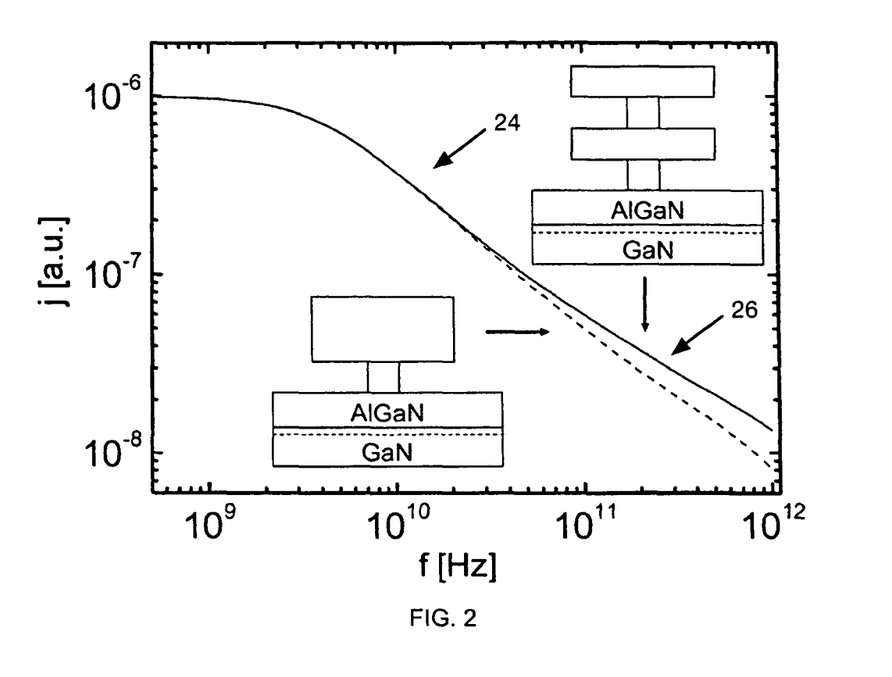
FIG. 2: shows the frequency response of the achievable current density and a comparison to the prior art.

FIG. 2 shows a log-log plot of the frequency response of the current density j achievable in the high-frequency conductor against the frequency f for the high-frequency conductor according to FIG. 1a (solid line) and FIG. 1b (dotted line). For frequencies starting at approximately $2*10^{10}$ Hz, a considerable gain in current density is apparent with the same use of base material. The maximum operating frequency 26 of the transistor 12 for the high-frequency conductor according to FIG. 1a (solid line) occurs in a region of FIG. 2 where there is a gain in current density relative to the high-frequency conductor according to FIG. 1b (dotted line) (e.g., relative to the prior art.) The minimum operating frequency 24 is less than the maximum operating frequency 26.

Figure 3A:
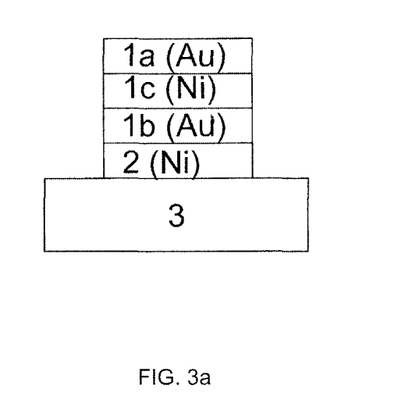
FIG. 3: shows an exemplary embodiment of the production method according to the invention.
Figure 3B:
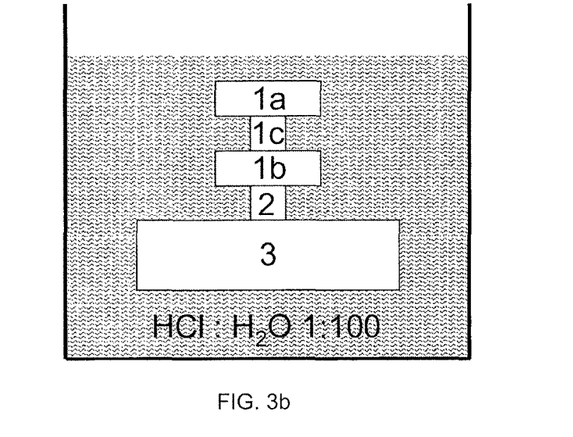

FIG. 3 shows an exemplary embodiment of the production method according to the invention, which was used to produce the high-frequency conductor shown in FIG. 1a. Initially, alternating layers of nickel and gold, each having a thickness of 200 nm, were grown onto a commercially available AlGaN/GaN heterostructure 3 that was grown onto a sapphire substrate (FIG. 3a). The heterostructure is composed of a 3 μm thick undoped GaN buffer layer, on which a 30 nm thick AlGaN barrier is located. AlN accounts for 26% in the mole fraction of this barrier. After having been grown on, the layer stack is exposed to hydrochloric acid diluted with water ($HCl:H_2$) 1:100), which attacked the nickel layers both from the right and the left (FIG. 3b). After etching, the layer stack was rinsed for 10 minutes in deionized water to stop further degradation of the nickel layers. AFM measurements showed that by the etching the mean (rms) roughness was not increased by the etching.

A nickel intermediate piece 2, which defines the gate length of the high electron mobility transistor (HEMT), remained directly on the heterostructure 3. The second nickel intermediate piece 1c connects the two segments 1a and 1b of the base material, which is gold.

Figure 4A:
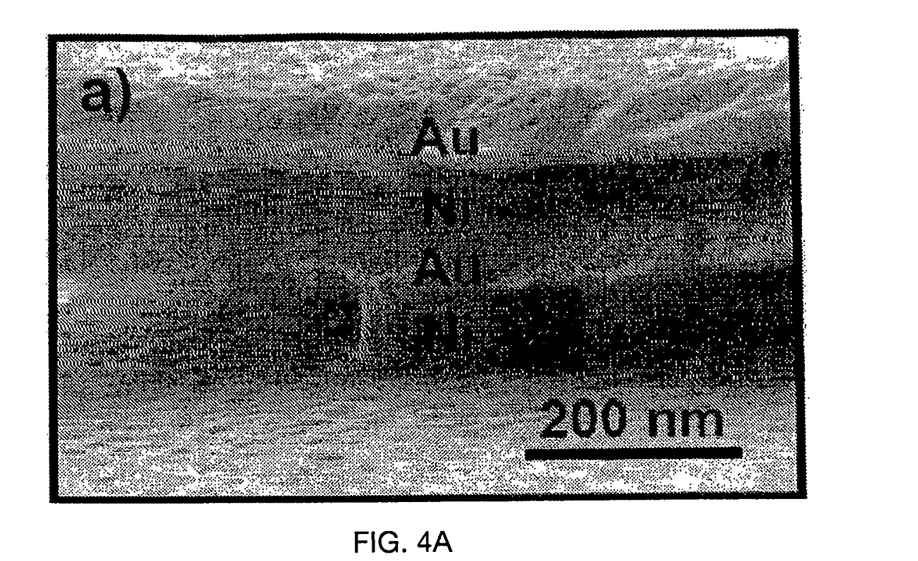
FIGS. 4a and 4b show, respectively, a scanning electron microscope image of the high-frequency conductor according to the invention and according to the prior art.
Figure 4B:
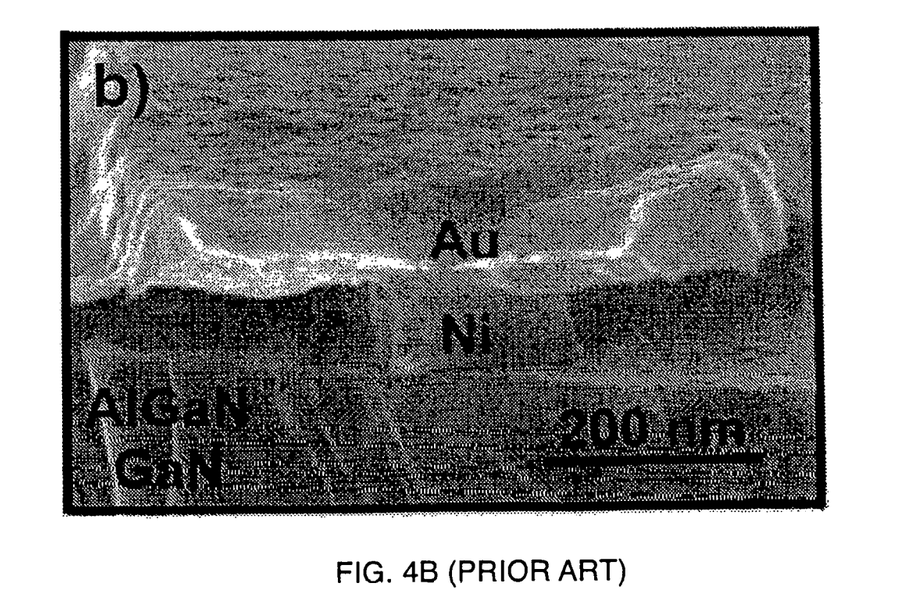

FIG. 4a shows a scanning electron microscope image of the high-frequency conductor according to the invention produced in this way, which corresponds to the pattern according to FIG. 1a, in a cross-sectional view (two-level T-gate). For comparison, FIG. 4b shows a cross-sectional view of a scanning electron microscope image of one example of the conventional T-gate structure (one-level T-gate) according to the prior art, which corresponds to the pattern according to FIG. 1b.

Figure 5:
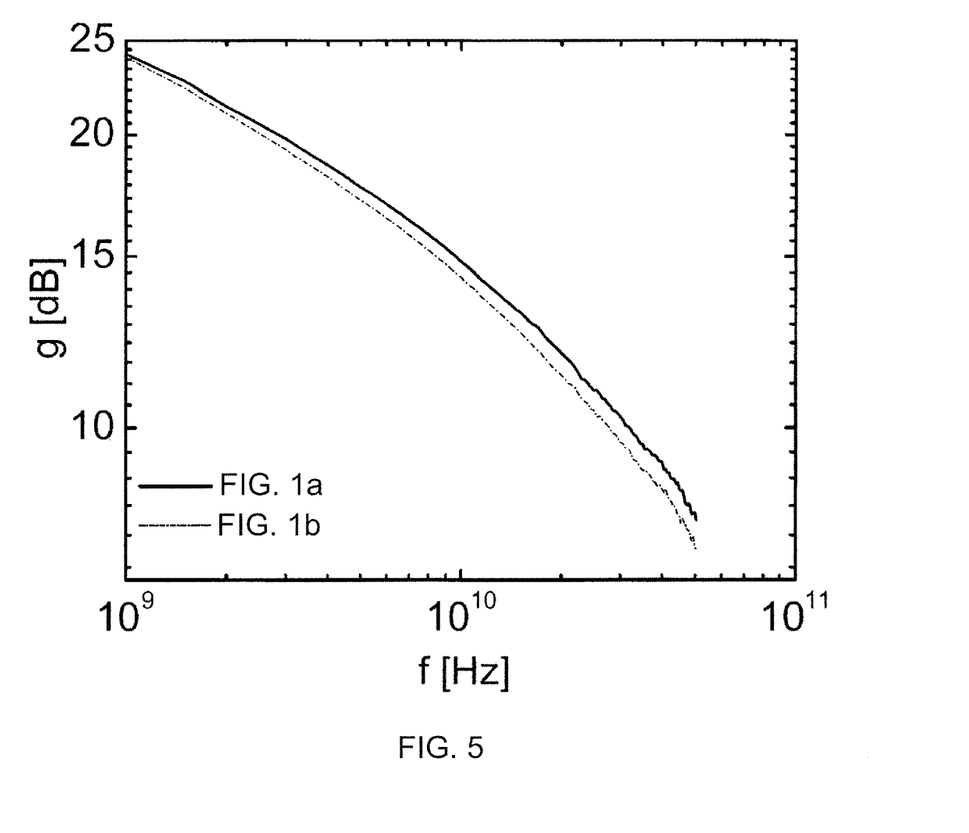
FIG. 5: shows a frequency response of the short circuit current gain of a transistor with the high-frequency conductor according to the invention as the gate, and a transistor comprising a gate according to the prior art.

FIG. 5 shows the frequency response of the short circuit current gain g of a transistor comprising a conventional T-gate according to the prior art (FIG. 1b; thin dotted line) and of a transistor comprising a two-level T-gate according to the invention (FIG. 1a: thick solid line), each plotted against the frequency f. The two transistors are otherwise identically structured. The advantage of the transistor comprising the high-frequency conductor according to the invention as the gate is apparent at high frequencies. The high-frequency conductor according to the invention thus imparts a higher cut-off frequency $f_{max}$ (maximum frequency transmitted without attenuation) to the transistor.

The invention claimed is:

1. A high-frequency electrode conductively coupled to a terminal of a transistor, the electrode, terminal, and transistor being formed as an integrated circuit on a substrate by semiconductor fabrication processes, the transistor having a pre-designed minimum operating frequency, a pre-designed maximum operating frequency, and an operating frequency range that encompasses $2*10^{10}$ Hz, a current flowing through the electrode, terminal and transistor in a pre-defined direction during operation of the transistor, the electrode comprising:

a high-frequency conductor conductively coupled to the terminal by a first intermediate conductor to establish a Schottky contact between the high-frequency conductor and the terminal;

wherein the high-frequency conductor comprises a first segment, a second segment, and a second intermediate conductor, the first segment and second segment lacking physical communication with each other, with the terminal, and with the substrate, the first segment further lacking physical communication with the first intermediate conductor;

the second intermediate conductor being located between the first segment and second segment and being in physical and electrical communication with each one of the first segment and second segment, said current flowing through said first segment, said second intermediate conductor, said second segment, said first intermediate conductor; said terminal, and said transistor in order according to the pre-defined direction;

wherein along a first surface of the first segment where the first surface makes contact with a second surface of the second intermediate conductor, the first surface has greater surface area than the second surface so as to extend beyond the second surface;

wherein along a third surface of the second segment where the third surface makes contact with a fourth surface of the second intermediate conductor, the third surface has greater surface area than the fourth surface so as to extend beyond the fourth surface;

wherein along a fifth surface of the second segment where the fifth surface makes contact with a sixth surface of the first intermediate conductor, the fifth surface has greater surface area than the sixth surface so as to extend beyond the sixth surface;

wherein current flows at a surface region of said first segment and a surface region of said second segment to a skin depth, each one of said first segment and said second segment having a thickness along a common dimension that is at least two times the skin depth for current flowing at said maximum operating frequency and no more than 2.5 times the skin depth for current flowing at said minimum operating frequency;

wherein the second intermediate conductor is a metal from group 3A or 4A or a transition metal or comprises at least one such metal as an alloying element, the second intermediate conductor being of different material composition than each of the first segment and second segment; and wherein each one of the first intermediate conductor and second intermediate conductor are etchable by an etchant substance to which the first segment and second segment resist etching.

2. The high-frequency electrode according to claim 1, wherein the metal of the second intermediate conductor belongs to the group (Ti, V, Cr, Mn, Fe, Co, Ni, Cu, Zn) or comprises at least one metal from this group as an alloying element.

3. The high-frequency electrode according to claim 1, wherein each one of the first segment and second segment comprises a base material that is carbon or a precious metal or semi-precious metal, or at least one material from this group as an alloying element.

4. The high-frequency electrode according to claim 1, wherein each one of the first segment and second segment comprises a base material that belongs to the group (Ru, Rh, Pd, Ag, Os, Ir, Pt, Au) or at least one metal from this group as an alloying element.

5. The high-frequency electrode according to claim 1, configured as a control electrode of the transistor.

6. The high-frequency electrode according to claim 5, configured as a gate electrode of the transistor, and wherein the transistor is a field effect transistor.

7. The high-frequency electrode according to claim 6, wherein the terminal is a gate terminal, and the high-frequency electrode is coupled to the gate terminal of the field effect transistor with the first intermediate conductor, said first intermediate conductor defining a gate length of said field effect transistor.

8. A method for producing the high-frequency electrode according to claim 1, comprising:

growing on the substrate, in order as a layer stack, a material from which the first intermediate conductor is formed, a material from which the second segment is formed, a material from which the second intermediate conductor is formed, and a material from which the first segment is formed; and exposing the layer stack to said etchant substance which isotropically etches the material from which the first intermediate conductor is formed and the material from which the second intermediate conductor is formed, thereby leaving each one of the first segment and second segment to have said greater surface area than each one of the first intermediate conductor and the second intermediate conductor.

9. The method according to claim 8, wherein said exposing comprises exposing the layer stack to a dilutable etchant, which is said etchant substance.

10. A high-frequency electrode conductively coupled to a terminal of a photodetector, the electrode, terminal, and photodetector being formed as an integrated circuit on a substrate by semiconductor fabrication processes, the photodetector having a pre-designed minimum operating frequency, a pre-designed maximum operating frequency, and an operating frequency range that encompasses $2*10^{10}$ Hz a current flowing through the electrode, terminal and photodetector in a pre-defined direction during operation of the photodetector, the electrode comprising:

a high-frequency conductor conductively coupled to the terminal by a first intermediate conductor to establish a Schottky contact between the high-frequency conductor and the terminal;

wherein the high-frequency conductor comprises a first segment, a second segment, and a second intermediate conductor, the first segment and second segment lacking physical communication with each other, with the terminal, and with the substrate, the first segment further lacking physical communication with the first intermediate conductor;

the second intermediate conductor being located between the first segment and second segment and being in physical and electrical communication with each one of the first segment and second seat lent, said current flowing through said first segment, said second intermediate conductor, said second segment said first intermediate conductor; said terminal, and said transistor in order according to the pre-defined direction;

wherein along a first surface of the first segment where the first surface makes contact with a second surface of the second intermediate conductor, the first surface has greater surface area than the second surface so as to extend beyond the second surface;

wherein along a third surface of the second segment where the third surface makes contact with a fourth surface of the second intermediate conductor, the third surface has greater surface area than the fourth surface so as to extend beyond the fourth surface;

wherein along a fifth surface of the second segment where the fifth surface makes contact with a sixth surface of the first intermediate conductor, the fifth surface has greater surface area than the sixth surface so as to extend beyond the sixth surface;

wherein current flows at a surface region of said first segment and a surface region of said second segment to a skin depth, each one of said first segment and said second segment having a thickness along a common dimension that is at least two times the skin depth for current flowing at said maximum operating frequency and no more than 2.5 times the skin depth for current flowing at said minimum operating frequency;

wherein the second intermediate conductor is a metal from group 3A or 4A or a transition metal or comprises at least one such metal as an alloying element, the second intermediate conductor being of different material composition than each of the first segment and second segment;

wherein each one of the first intermediate conductor and second intermediate conductor are etchable by an etchant substance to which the first segment and second segment resist etching; and wherein the high-frequency electrode is configured as a collector electrode or drain electrode of the photodetector.

* * * * *